US005436977A

United States Patent [19]

Sato

[11] Patent Number: 5,436,977

[45] Date of Patent: Jul. 25, 1995

[54] SPEAKER SYSTEM

[75] Inventor: Hiroshi Sato, Kanagawa, Japan

[73] Assignee: Sony Corporation, Tokyo, Japan

[21] Appl. No.: 190,900

[22] Filed: Feb. 3, 1994

[30] Foreign Application Priority Data

Feb. 19, 1993 [JP] Japan .................................. 5-053249

[51] Int. Cl.[6] ........................ H04R 25/00; H05K 5/00; A47B 81/06

[52] U.S. Cl. .................................... 381/154; 381/159; 181/156; 181/199

[58] Field of Search ................. 381/159, 90, 154, 156, 381/88; 181/148, 155, 160, 144, 156

[56] References Cited

U.S. PATENT DOCUMENTS 3,142,353 10/1962 Todisco .
3,684,051 8/1972 Hopkins .
4,142,603 3/1979 Johnson .............................. 181/148
4,231,445 11/1980 Johnson .
4,284,166 8/1981 Gale .
5,004,066 4/1991 Furukawa ........................... 381/159
5,115,473 5/1992 Yamagishi et al. ................. 381/159
5,123,500 6/1992 Malhoit et al. ..................... 181/144
5,189,706 2/1993 Saeki ................................... 381/159

FOREIGN PATENT DOCUMENTS 456416 11/1991 European Pat. Off. .
0234195 10/1986 Japan .................................. 381/159
905560 9/1962 United Kingdom .
8203961 11/1982 WIPO .
8901728 2/1989 WIPO .

*Primary Examiner*—Curtis Kuntz
*Assistant Examiner*—Sinh Tran
*Attorney, Agent, or Firm*—Jay H. Maioli

[57] ABSTRACT

A speaker system includes a speaker unit, a cabinet, and a pair of ducts. The cabinet has a baffle plate. The speaker unit is mounted on the baffle plate. The pair of ducts have parallel axes. Each of the ducts has a first end mounted on the baffle plate and a second end disposed in the cabinet. The first end of each duct defines an outer opening formed in a plane parallel to a surface of the baffle plate, and the second end of each duct defines an inner opening at least a part of which is formed in a plane not parallel to the plane forming the outer opening. Each duct has a shape such that a sectional area of each duct is gradually reduced from one of the inner and outer openings to the other opening.

10 Claims, 19 Drawing Sheets

SPEAKER SYSTEM

BACKGROUND OF THE INVENTION

1. Field of the Invention

The present invention relates to a speaker system, and more particularly to a phase-inverted type of speaker system.

2. Description of the Related Art

Widely known is a phase-inverted type of speaker system (which will be hereinafter referred to as a bass-reflex type of speaker system) having a duct for giving a suitable change in phase to a sound wave radiated from a rear surface of a speaker unit and a radiating sound wave in phase with a sound wave radiated from a front surface of the speaker unit.

Such a bass-reflex type of speaker system has a structure as shown in FIGS. 1*a* and 1*b*, wherein FIG. 1*a* is a front elevation of the speaker system, and FIG. 1*b* is a cross section taken along the line X—X in FIG. 1*a*. The speaker system includes an enclosure 1, a baffle plate 2 forming a front surface of the enclosure 1, a speaker 3, and a pair of bass-reflex ducts (which will be hereinafter referred to simply as ducts) 4. The speaker unit 3 is mounted to the baffle plate 2. Each duct 4 is cylindrical, and it is integrally formed with the baffle plate 2 or is mounted to the baffle plate 2.

The phase of sound wave $A_2$ radiated from the rear surface of the speaker unit 3 is opposite to the phase of sound wave $A_1$ radiated from the front surface of the speaker unit 3. The sound wave $A_2$ radiated to an inside space 5 of the enclosure 1 is introduced into the duct 4 from an inner opening 4*a* of the duct 4, and is then radiated from an outer opening 4*b* of the duct 4 to the front side of the speaker system. The volume of the inside space 5, the length of the duct 4, the areas of the inner and outer openings 4*a* and 4*b*, etc. are set so that the phase of the sound wave $A_2$ to be radiated from the outer opening 4*b* becomes the same as the phase of the sound wave $A_1$.

However, the bass-reflex type of speaker system as shown in FIGS. 1*a* and 1*b* has the following problems.

First, there is a problem in production. As the duct is formed usually in a cylindrical or prismatic shape, a large space for packaging is required in packaging a plurality of such ducts as independent parts, thus greatly reducing a transporting efficiency and increasing a transporting cost.

That is, as the duct is cylindrical or prismatic, a plurality of such ducts cannot be stacked together in a telescopic fashion. In the condition where the duct is mounted to the baffle plate, a plurality of such baffle plates cannot be stacked in close relationship to each other. Accordingly, a depth corresponding to the total length of the ducts is required in packaging the baffle plates, thus resulting in a large dead space in a packaged condition of the baffle plates.

Secondly, there is a problem in sound quality. As shown by an arrow M in FIG. 2, resonance in an air column is possibly generated in the duct 4. At a frequency of a sound wave having a wavelength four times the length of the duct 4, the resonance shown by the arrow M is generated to adversely affect a sound quality.

Further, when the area of the inner opening 4*a* of the duct 4 is small, a so-called wind noise is generated by air flowing from the inner opening 4*a* into the duct 4, which also causes a deterioration in sound quality. Accordingly, it is necessary to ensure a sufficient area of the inner opening 4*a* to such an extent as to suppress the wind noise, which will reduce a degree of freedom in designing the shape of the duct 4.

Further, in the speaker system having a plurality of, e.g., a pair of ducts 4 as shown in FIGS. 1*a* and 1*b*, a slight phase difference between sound waves to be radiated from the ducts is apt to generate, which also causes a deterioration in sound quality.

SUMMARY OF THE INVENTION

It is therefore an object of the present invention to provide a speaker system which resolves the above-mentioned problems.

It is another object of the present invention to provide a baffle plate for a speaker system which resolves the above-mentioned problems.

According to the present invention, there is provided a speaker system including a speaker unit, a cabinet, and at least one duct. The cabinet has a baffle plate. The speaker unit is mounted to the baffle plate. The duct has a first end mounted to the baffle plate and a second end disposed in the cabinet. The first end of the duct defines an outer opening formed in a plane parallel to a surface of the baffle plate, and the second end of the duct defines an inner opening at least a part of which is formed in a plane not parallel to the plane forming the outer opening.

According to the present invention, there is provided a speaker system including a speaker unit, a cabinet, and a pair of ducts. The cabinet has a baffle plate. The speaker unit is mounted to the baffle plate. The pair of ducts have parallel axes. Each of the ducts has a first end mounted to the baffle plate and a second end disposed in the cabinet. The first end of each duct defines an outer opening formed in a plane parallel to a surface of the baffle plate, and the second end of each duct defines an inner opening at least a part of which is formed in a plane not parallel to the plane forming the outer opening. Each duct has a shape such that a sectional area of each duct is gradually reduced from one of the inner and outer openings to the other opening.

According to the present invention, there is provided a baffle plate for a speaker system, including a plate portion and at least one duct. The plate portion has a mounting hole for mounting a speaker unit. The duct is provided under the mounting hole. The duct has a first opening end mounted to the plate portion and a second opening end projecting from the plate portion. The duct has a shape such that a sectional area of the duct is gradually reduced from the first opening end to the second opening end. The duct is formed with a shoulder on an outer surface thereof.

According to the present invention, the duct is configured in such a manner that the sectional area thereof is gradually reduced from one of the inner and outer openings to the other opening. Furthermore, the outer opening of the duct exposed to the outside of the cabinet is formed in a plane parallel to the surface of the baffle plate, and the inner opening of the duct exposed to the inside of the cabinet is formed in a plane not parallel to the plane forming the outer opening. With this arrangement, the occurrence of resonance in air column and wind noise in the duct can be prevented. As a result, a sound quality of the speaker system can be improved. Further, a plurality of ducts or a plurality of baffle plates with ducts can be stacked together as independent parts, the stack of such independent parts can be efficiently packaged and transported.

BRIEF DESCRIPTION OF THE DRAWINGS

The invention will be more readily understood with reference to the accompanying drawings, wherein:

FIGS. 1*a* and 1*b* show a bass-reflex type of speaker system in the prior art, wherein FIG. 1*a* is a front elevation of the speaker system, and FIG. 1*b* is a cross section taken along the line X—X in FIG. 1*a;*

FIGS. 3*a* and 3*b* show a basic construction of a speaker system according to the present invention, wherein FIG. 3*a* is a front elevation of the speaker system, and FIG. 3*b* is a cross section taken along the Y—Y in FIG. 3*a;*

FIGS. 4*a* through 4*e*-1 and 4*e*-2 are views for explaining various orientations of inner openings of ducts in the speaker system according to the present invention, wherein FIG. 4*a* is a perspective view of the speaker system as viewed from the inside thereof; FIGS. 4*b*-1 and 4*b*-2 are views taken in the directions of the arrows U and R in FIG. 4*a,* respectively, when the angles of orientation of the inner openings are set to 90°; FIGS. 4*c*-1 and 4*c*-2 are views taken in the directions of the arrows U and R in FIG. 4*a,* respectively, when the angles of orientation of the inner openings are set to—90°; FIGS. 4*d*-1 and 4*d*-2 are views taken in the directions of the arrows U and R in FIG. 4*a,* respectively, when the angles of orientation of the inner openings are set to 0°; and FIGS. 4*e*-1 and 4*e*-2 are views taken in the directions of the arrows U and R in FIG. 4*a,* respectively, when the angles of orientation of the inner openings are set to 45°;

FIGS. 5*a* and 5*b* are views for explaining a stacked condition of plural ducts according to a preferred embodiment of the present invention, wherein FIG. 5*a* is a side view of one of the plural ducts, and FIG. 5*b* is a side view of the plural ducts stacked together;

FIGS. 6*a* and 6*b* are views for explaining a stacked condition of plural baffle plates each with the duct shown in FIGS. 5*a* and 5*b* mounted thereto, wherein FIG. 6*a* is a side view of one of the plural baffle plates, and FIG. 6*b* is a side view of the plural baffle plates stacked together;

FIGS. 7*a* and 7*b* are views for explaining a stacked condition of plural ducts according to another preferred embodiment of the present invention, wherein FIG. 7*a* is a side view of one of the plural ducts, and FIG. 7*b* is a side view of the plural ducts stacked together;

FIGS. 8*a* and 8*b* are views for explaining a stacked condition of plural baffle plates each with the duct shown in FIGS. 7*a* and 7*b* mounted thereto, wherein FIG. 8*a* is a side view of one of the plural baffle plates, and FIG. 8*b* is a side view of the plural baffle plates stacked together;

FIGS. 11*a* through 11*k* show a preferred embodiment of the baffle plate to be used in the speaker system according to the present invention, wherein FIG. 11*a* is a front elevation of the baffle plate; FIG. 11*b* is a side elevation of the baffle plate; FIG. 11*c* is a rear elevation of the baffle plate; FIG. 11*d* is a cross section taken along the line A—A in FIG. 11*a;* FIG. 11*e* is a cross section taken along the line B—B in FIG. 11*a;* FIG. 11*f* is a cross section taken along the line C—C in FIG. 11*a;* FIG. 11*g* is a cross section taken along the line D—D in FIG. 11*a;* FIG. 11*h* is a cross section taken along the line E—E in FIG. 11*a;* FIG. 11*i* is a view taken in the direction of the arrow F in FIG. 11*c;* FIG. 11*j* is a view taken in the direction of the arrow G in FIG. 11*c;* and FIG. 11*k* is a cross section taken along the line H—H in FIG. 11*a;*

FIGS. 12*a* through 12*l* show another preferred embodiment of the baffle plate to be used in the speaker system according to the present invention, wherein FIG. 12*a* is a front elevation of the baffle plate; FIG. 12*b* is a side elevation of the baffle plate; FIG. 12*c* is a rear elevation of the baffle plate; FIG. 12*d* is a top plan view of the baffle plate; FIG. 12*e* is a cross section taken along the line A—A in FIG. 12*a; * FIG. 12*f* is a cross section taken along the line B—B in FIG. 12*a; * FIG. 12*g* is a cross section taken along the line C—C in FIG. 12*a; * FIG. 12*h* is a cross section taken along the line D—D in FIG. 12*a; * FIG. 12*i* is a cross section taken along the line E—E in FIG. 12*a; * FIG. 12*j* is a cross section taken along the line F—F in FIG. 12*a; * FIG. 12*k* is a view taken in the direction of the arrow G in FIG. 12*c; * and FIG. 12*l* is a view taken in the direction of the arrow H in FIG. 12.

DETAILED DESCRIPTION OF THE PREFERRED EMBODIMENTS

Figure 3A:
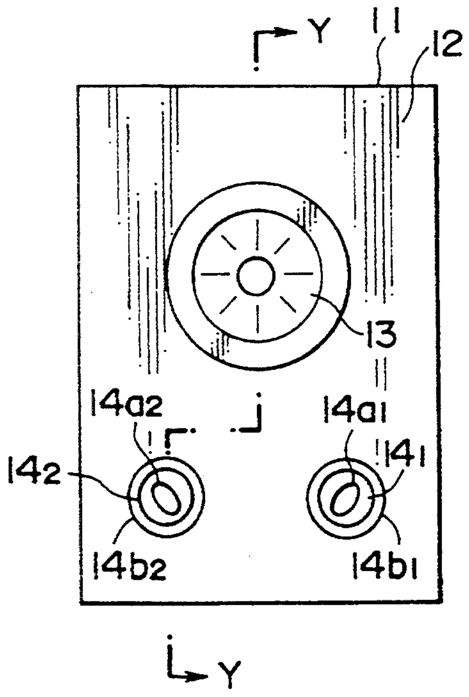
Figure 3B:
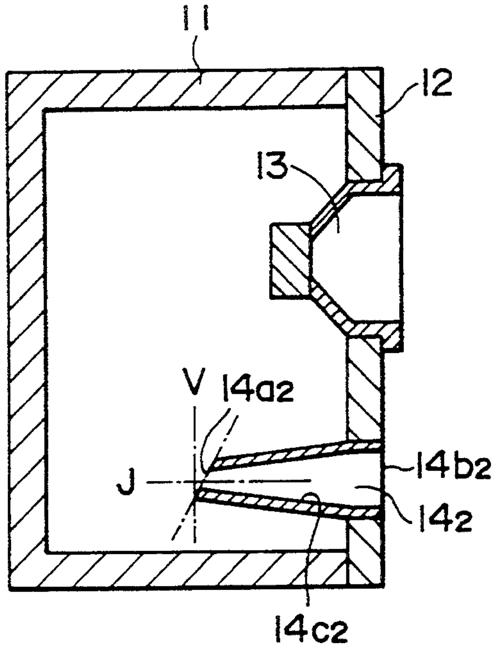

A bass-reflex type of speaker system according to the present invention will now be described in detail with reference to the drawings. FIGS. 3*a* and 3*b* show a basic construction of a speaker system according to a preferred embodiment of the present invention, wherein FIG. 3*a* is a front elevation of the speaker system, and FIG. 3*b* is a cross section taken along the line Y—Y in FIG. 3*a.* The speaker system includes an enclosure or cabinet 11, a baffle plate 12, a speaker unit 13, and a pair of ducts $\mathbf{14}_1$ and $\mathbf{14}_2$ having parallel axes. While the pair of ducts $\mathbf{14}_1$ and $\mathbf{14}_2$ are provided in this preferred embodiment, a single duct may be used.

As shown in FIG. 3*b,* the duct $\mathbf{14}_2$ is mounted at one end thereof to the baffle plate 12, and the other end of the duct $\mathbf{14}_2$ is disposed in the enclosure 11. Reference numeral $\mathbf{14c}_2$ denotes a body of the duct $\mathbf{14}_2$. The body $\mathbf{14c}_2$ has an inner opening $\mathbf{14a}_2$ exposed to the inside of the enclosure 11 and an outer opening $\mathbf{14b}_2$ exposed to the front side of the baffle plate 12. The body $\mathbf{14c}_2$ is substantially frustoconical in shape such that it is tapered from the outer opening $\mathbf{14b}_2$ to the inner opening $\mathbf{14a}_2$. That is, both the inner and outer surfaces of the body $\mathbf{14c}_2$ are tapered from the outer opening $\mathbf{14b}_2$ to the inner opening $\mathbf{14a}_2$. In modification, the body $\mathbf{14c}_2$ may be tapered from the inner opening $\mathbf{14a}_2$ to the outer opening $\mathbf{14b}_2$. Further, while the body $\mathbf{14c}_2$ is straight tapered in this preferred embodiment, it may be curvedly tapered.

The inner opening $\mathbf{14a}_2$ is formed in a plane inclined with respect to a vertical plane V perpendicular to an axis J of the duct $\mathbf{14}_2$. That is, the body $\mathbf{14c}_2$ of the duct $\mathbf{14}_2$ has a shape of an obliquely truncated cone so that the inner opening $\mathbf{14a}_2$ is oblique.

While the construction of the duct $14_2$ has been described above, the other duct $14_1$ also has the same construction as that of the duct $14_2$.

Thus, each duct is constructed so that the body is substantially frustoconical in shape and the inner opening is formed in an oblique plane.

Figure 9:
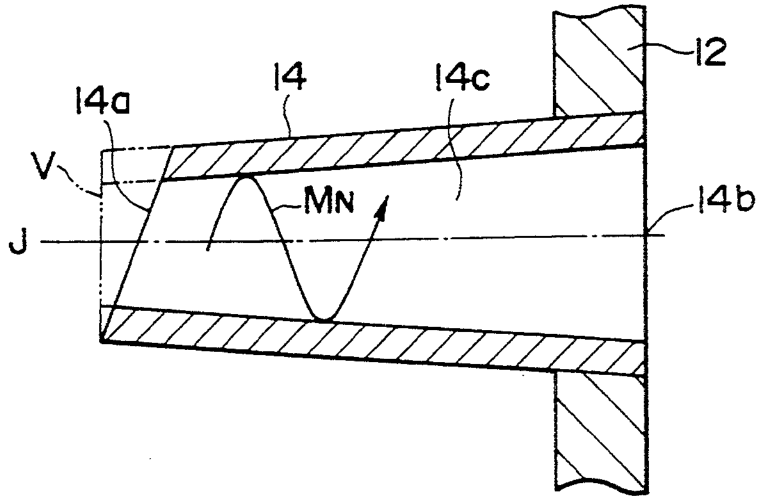
FIG. 9 is a sectional view for explaining the functions of a body and an inner opening of the duct according to the present invention.

As shown in FIG. 9, wherein the ducts $14_1$ and $14_2$ shown in FIGS. *3a* and *3b* are represented by a duct 14 having a body 14*c*, an inner opening 14*a*, and an outer opening 14*b*, the inner surface of the body 14*c* of the duct 14 is a substantially frustoconical surface with no parallel surfaces. As a result, sound wave are reflected on the conical inner surface of the body 14*c* as shown by an arrow $M_N$ in FIG. 9, thereby suppressing the occurrence of resonance in air column.

Furthermore, since the inner opening 14*a* is oblique as shown in FIG. 9, a large area of the inner opening 14*a* can be ensured, thereby preventing the occurrence of wind noise. That is, as shown in FIG. 9, the body 14*c* is substantially frustoconical such that it is tapered from the outer opening 14*b* to the inner opening 14*a*. Accordingly, if the inner opening 14*b* were formed in the vertical plane V perpendicular to the axis J of the duct 14, a reduction in area of the inner opening 14*a* would become unavoidable. In view of this, the inner opening 14*a* in this preferred embodiment is formed in a plane inclined with respect to the vertical plane V, thereby ensuring a sufficient area of the inner opening 14*a* as compared with the above case where the inner opening 14*a* is formed in the vertical plane V as shown by a phantom line in FIG. 9.

Figure 5B:
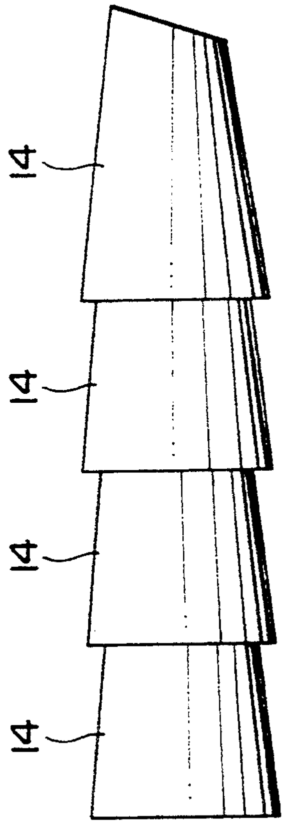
Figure 5A:
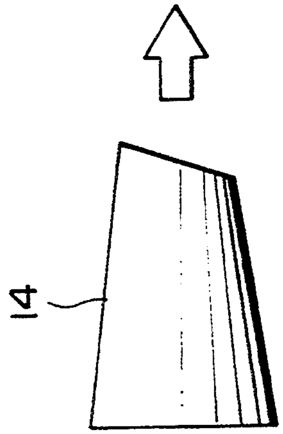
Figure 6B:
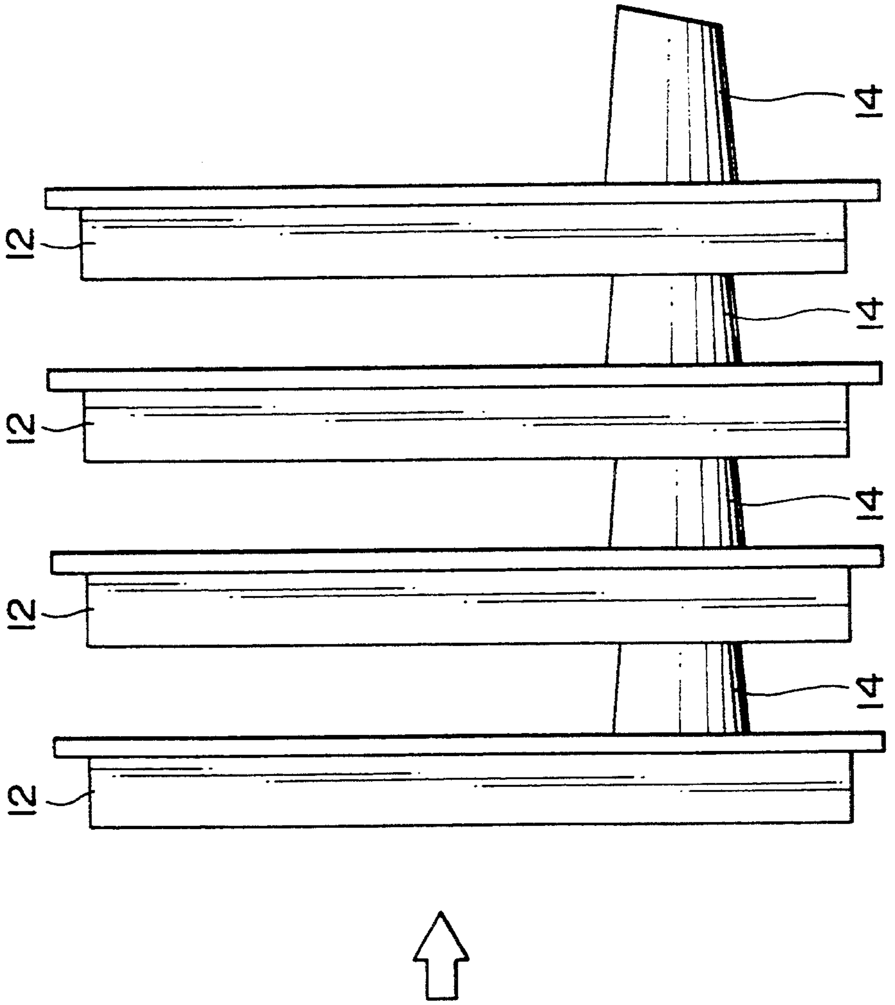
Figure 6A:
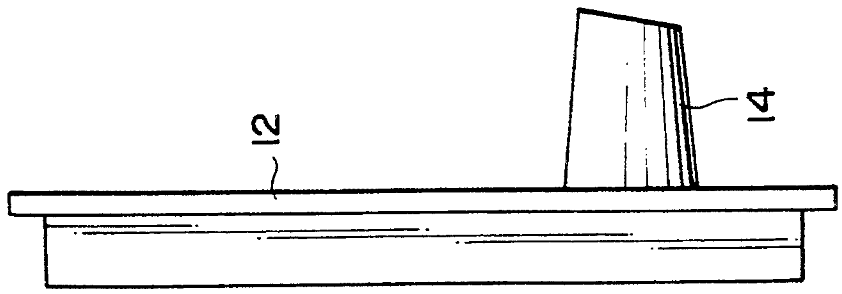

Furthermore, since the body 14*c* of the duct 14 is substantially frustoconical as shown in FIG. 9, a plurality of ducts 14 each constituting an independent component as shown in FIG. 5*a* can be stacked in a telescopic fashion as shown in FIG. 5*b*. Furthermore, when an assembly of the duct 14 and the baffle plate 12 is handled as an independent component as shown in FIG. 6*a*, a plurality of such assemblies can be stacked with a reduced dead space as shown in FIG. 6*b*.

As described above, the speaker system according to the present invention is provided with at least one pair of ducts each having a substantially frustoconical body with an inner opening thereof being oblique as shown in FIGS. *3a* and *3b*. In addition, the oblique inner openings of the pair of ducts are opposed to each other at the same inclined angle ranging from −90° to +90° assuming that a line connecting the axes of the ducts defines a reference angle of 0°.

Figure 4A:
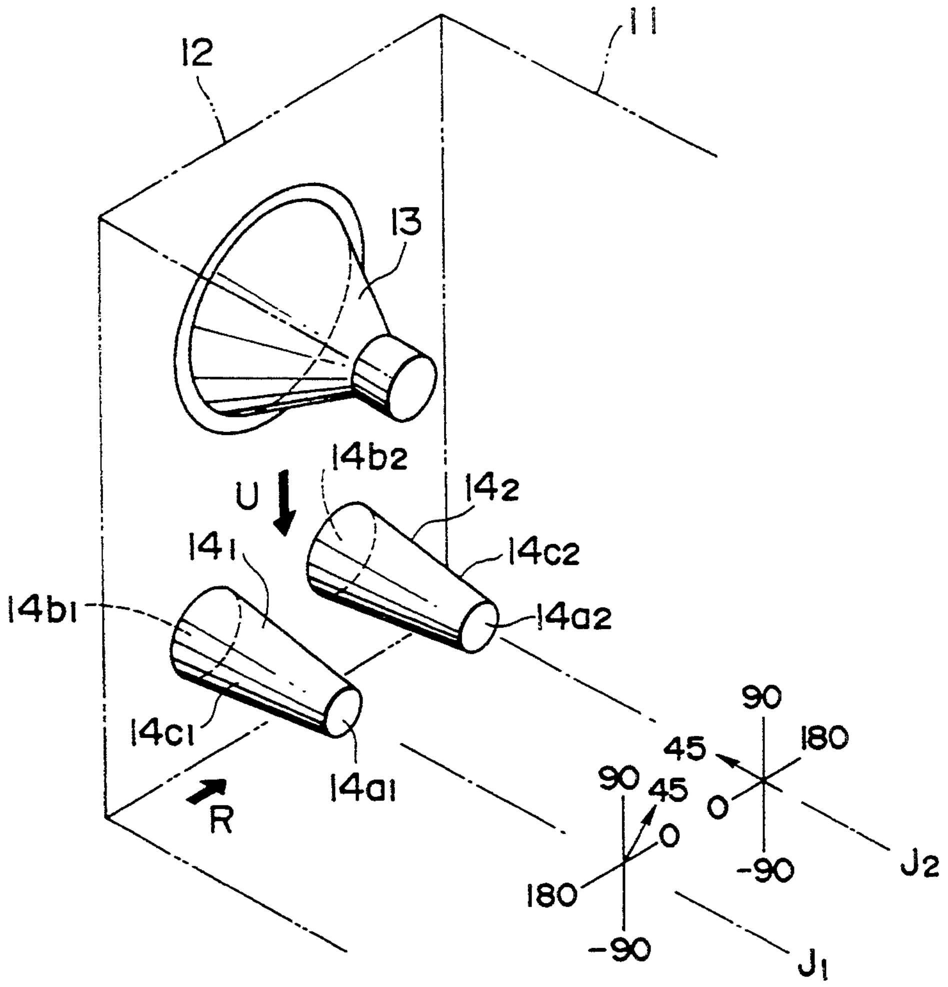

This arrangement will now be described more specifically with reference to FIGS. 4*a* to 4*e*-1 and 4*e*-2. FIG. 4*a* is a perspective view of the speaker system as viewed from the inside of the enclosure 11. The speaker system is provided with a pair of ducts $14_1$ and $14_2$ in this case. For the convenience of illustration, the inner openings $14a_1$ and $14a_2$ of the ducts $14_1$ and $14_2$ are shown in the vertical plane V perpendicular to the axes $J_1$ and $J_2$ of the ducts $14_1$ and $14_2$, respectively.

It is assumed that angular coordinates are provided in the vertical plane V perpendicular to the axes $J_1$ and $J_2$ of the ducts $14_1$ and $14_2$, respectively. In the angular coordinate for the duct $14_1$, the angle of direction from the axis $J_1$ of the duct $14_1$ to the axis $J_2$ of the duct $14_2$ is defined as 0°. Similarly, in the angular coordinate for the duct $14_2$, the angle of direction from the axis $J_2$ of the duct $14_2$ to the axis $J_1$ of the duct $14_1$ is defined as 0°.

FIGS. 4*b*-1 and 4*b*-2 to 4*e*-1 and 4*e*-2 show various typical angular positions of the oblique inner openings $14a_1$ and $14a_2$ as viewed from the arrow U (from the upper side of the speaker system) and the arrow R (from the right-hand side of the speaker system) shown in FIG. 4*a*.

Figure 1A:
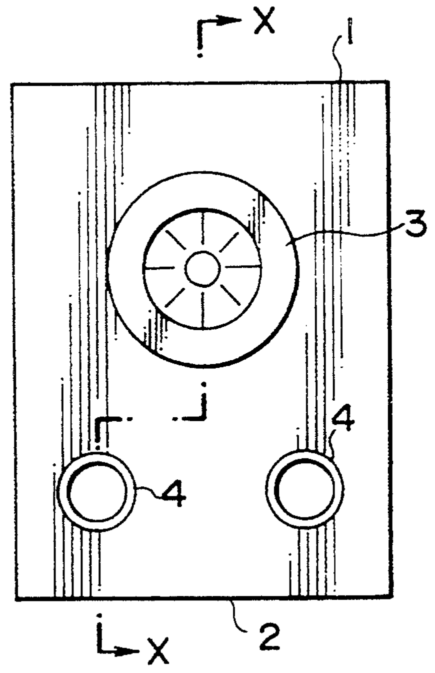
FIG. 1a PRIOR ART
Figure 1B:
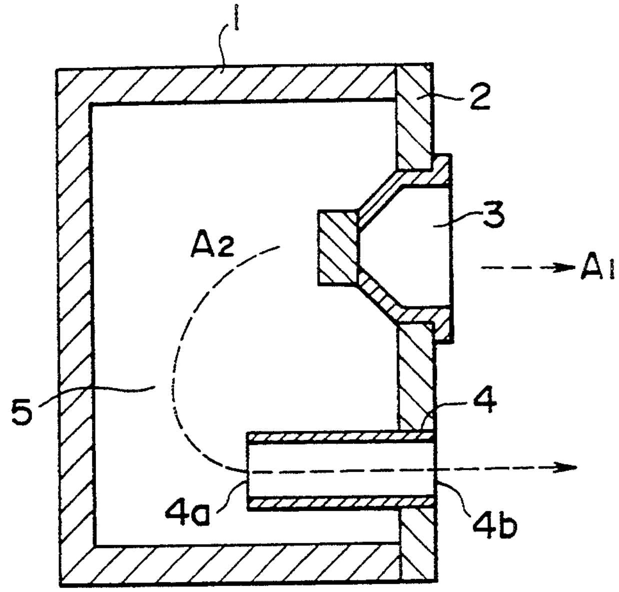
FIG. 1b PRIOR ART
Figure 2:
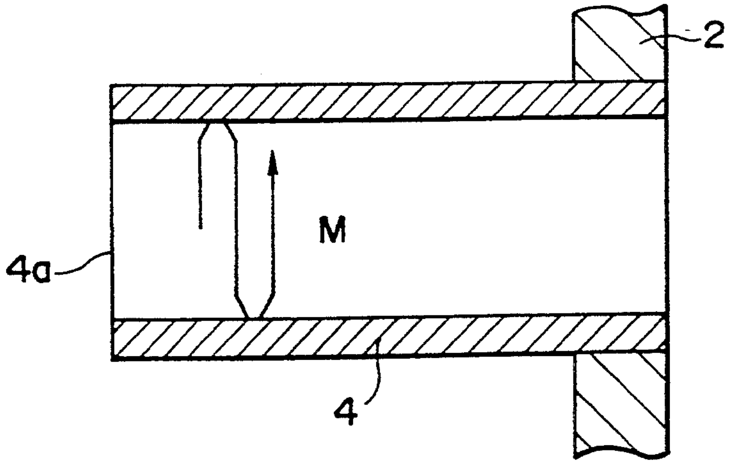
FIG. 2 PRIOR ART
FIG. 2 is a sectional view for explaining resonance in air column occurring in ducts of the speaker system in the prior art.
Figures 1, 4B:
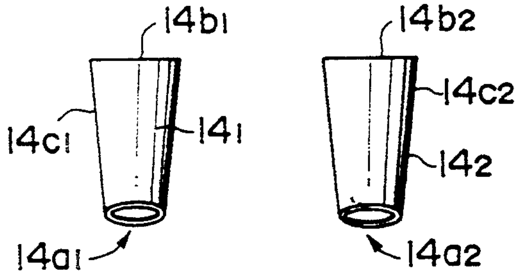

In the angular position shown in FIGS. 4*b*-1 and 4*b*-2, the angles of orientation of the oblique inner openings $14a_1$ and $14a_2$ are both set at 90°, that is both are oriented to the upper side of the speaker system.

Figures 1, 4C:
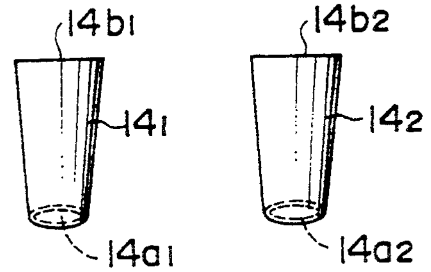
Figures 2, 4B:
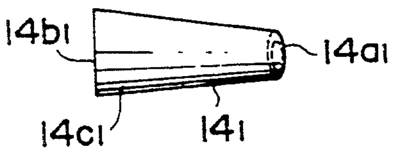
Figures 2, 4C:
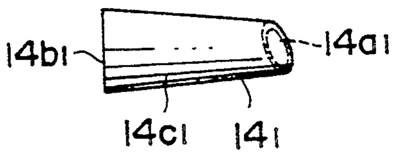

In the angular position shown in FIGS. 4*c*-1 and 4*c*-2, the angles of orientation of the oblique inner openings $14a_1$ and $14a_2$ are both set at −90° that is, both are oriented to the lower side of the speaker system.

Figures 1, 4D:
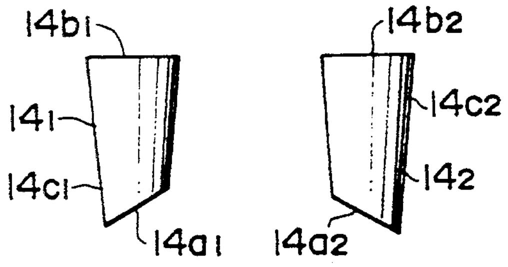

In the angular position shown in FIGS. 4*d*-1 and 4*d*-2, the angles of orientation of the oblique inner openings $14a_1$ and $14a_2$ are both set at 0°, that is, they are oriented to each other.

Figures 1, 4E:
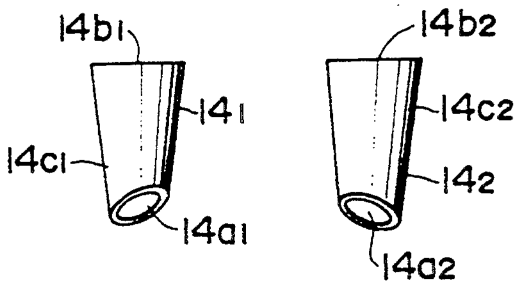
Figures 2, 4D:
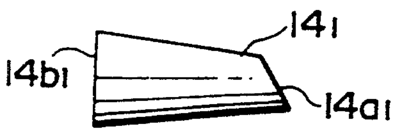
Figures 2, 4E:
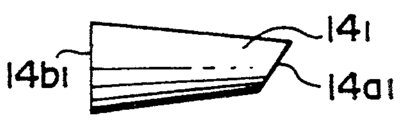

In the angular position shown in FIGS. 4*e*-1 and 4*e*-2, the angles of orientation of the oblique inner openings $14a_1$ and $14a_2$ are both set at 45°, that is both are oriented to the speaker unit 13.

Thus, the angles of orientation of the oblique inner openings $14a_1$ and $14a_2$ of the ducts $14_1$ and $14_2$ are set to a desired angle ranging from −90° (see FIGS. 4*c*-1 and 4*c*-2) through 0° (see FIGS. 4*d*-1 and 4*d*-2) to +90° (see FIGS. 4*b*-1 and 4*b*-2). That is, the angle of orientation of the inner opening $14a_1$ is set to the angle of orientation of the inner opening $14a_2$ in the range from −90° to +90°. Thus, the inner openings $14a_1$ and $14a_2$ of the ducts $14_1$ and $14_2$ are opposed to each other in the range between −90° and +90° (excluding ±90°).

According to this arrangement of the plural ducts wherein the inner openings of the ducts are opposed to each other, the conditions of introduction of sound waves into the ducts can be made substantially equal to each other. Accordingly, sound waves to be radiated from the ducts can be easily made equal to each other. Further, tone control can be effected by variously changing the angles of orientation of the inner openings of the ducts.

Further, in the speaker system according to the present invention, the body 14*c* of the duct 14 is substantially frustoconical and the inner opening 14*a* is oblique. In particular, the inner opening 14*a* is substantially opposed to the speaker unit 13 mounted on the baffle plate 12. More specifically, in the preferred embodiment shown in FIG. 4*a*, the speaker unit 13 is located above the ducts $14_1$ and $14_2$ at an elevation angle of about 45°. Therefore, the angles of orientation of the inner openings $14a_1$ and $14a_2$ of the ducts $14_1$ and $14_2$ are both set to 45° as shown in FIGS. 4*e*-1 and 4*e*-2, so that the inner openings $14a_1$ and $14a_2$ are both opposed to the speaker unit 13.

With this arrangement wherein the oblique inner opening of the duct is opposed to the speaker unit, the sound wave radiated from the rear surface of the speaker unit and directly reaching the inner opening of the duct can be efficiently introduced into the duct to thereby relatively reduce a resonance component by reflected sound waves in the enclosure.

Figure 10:
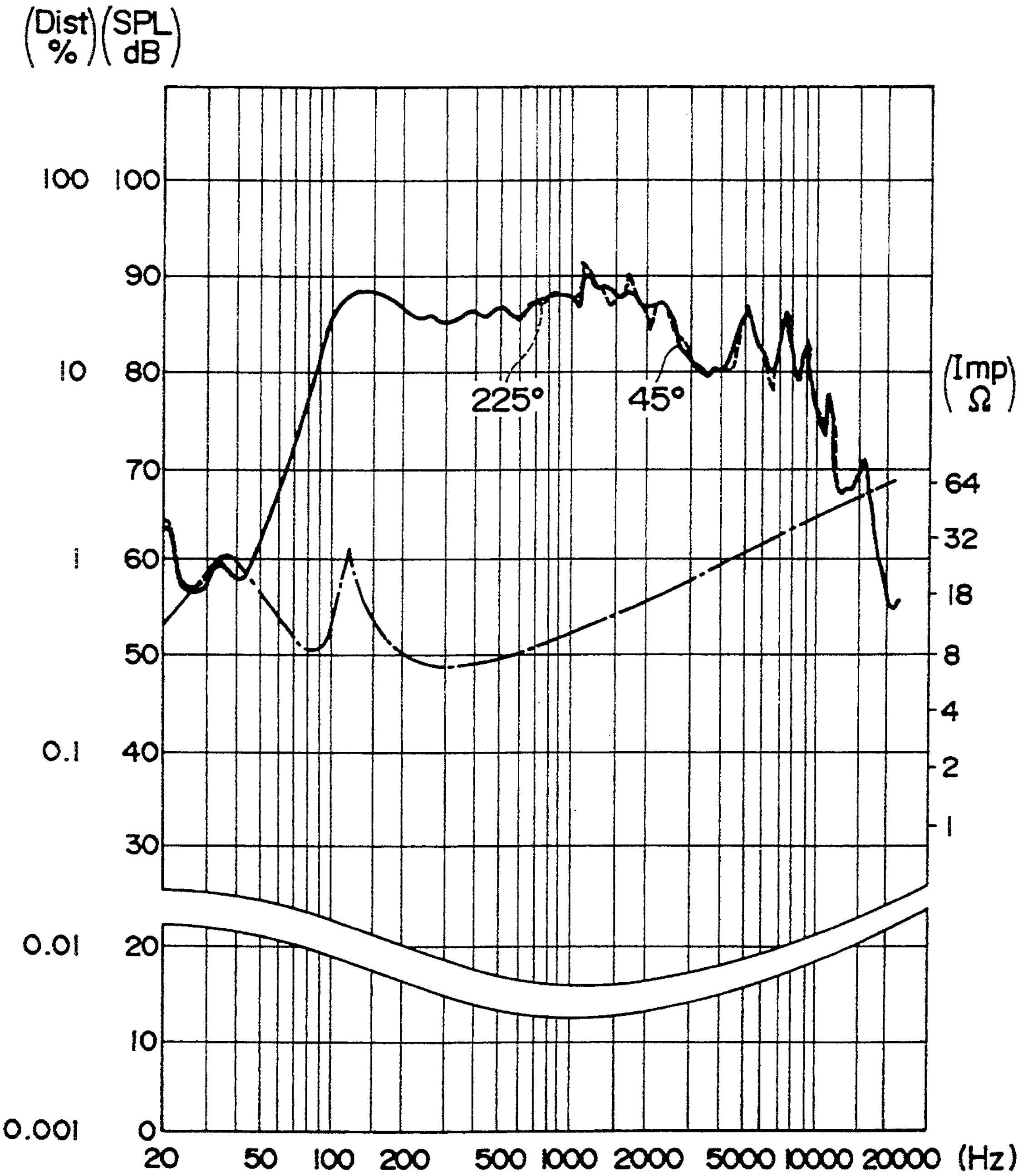
FIG. 10 is a graph showing a frequency characteristic of the speaker system using the duct according to the present invention.

FIG. 10 shows measurements of frequency characteristic and electric impedance in the case where the inner openings $14a_1$ and $14a_2$ of the ducts $14_1$ and $14_2$ are oriented at 45° as shown in FIGS. 4*e*-1 and 4*e*-2, that is, the inner openings $14a_1$ and $14a_2$ are opposed to the speaker unit 13, and in the case where the inner openings $14a_1$ and $14a_2$ are oriented at 225° different by 180° from the above case, that is, the inner openings $14a_1$ and $14a_2$ are directed to the side opposite the speaker unit 13

(actually, the measurements were performed by using a speaker system according to a preferred embodiment to be hereinafter described).

In FIG. 10, the solid line shows a frequency characteristic in the case of 45°; the dotted line shows a frequency characteristic in the case of 225°; and the dot-dash line shows an electric impedance in each case (the electric impedances in both cases almost accord with each other).

As apparent from FIG. 10, the frequency characteristic in the case of 45° is smoother than that in the case of 225° in a middle frequency range of 500 to 3000 KHz.

This result shows that the orientation of the oblique inner opening of the duct to the speaker unit reduces the resonance due to the reflection in the enclosure, thereby contributing to an improvement in sound quality.

There will now be described another preferred embodiment of the duct having the above-mentioned shape, wherein a shoulder is formed on the outer circumferential surface of the duct so that the shoulder abuts an end portion of another duct having the same shape as that of the above duct in stacking a plurality of such ducts.

As shown in FIG. *7a,* reference numeral 14 denotes a duct having such a structure. The duct 14 is formed with a shoulder 14d adapted to abut an end portion 14*e* of a body 14*c* of another duct 14 to be stacked together.

According to this structure that the shoulder 14*d* is formed on the outer circumferential surface of each duct 14, easy handling of the ducts 14 can be realized. That is, when a plurality of ducts each having no shoulder are stacked as shown in FIG. *5b,* there is a possibility that a certain duct may be strongly fitted with another duct to cause a difficulty of separating the former from the latter, or that a fitting length may be nonuniform to cause troublesome packaging of the ducts. In view of this possibility, by forming the shoulder 14*d* on the outer circumferential surface of each duct 14 as shown in FIG. *7a,* the plural ducts 14 can be uniformly stacked in the condition that the shoulder 14*d* abuts against the end portion 14*e*. Furthermore, excessive fitting of a certain duct with another duct to be stacked can be prevented, and accordingly the ducts stacked together can be easily separated from each other.

There will now be described a preferred embodiment of the baffle plate to which the duct 14 shown in FIG. *7a* is mounted. In this preferred embodiment, projections are formed on the outer surface of the baffle plate, and recesses are formed on the inner surface of the baffle plate. In stacking a plurality of baffle plates each having this structure, the projections of each baffle plate are engaged with the recesses of the adjacent baffle plate to be stacked, thereby positioning the plural baffle plates in the stacked condition.

Figure 8A:
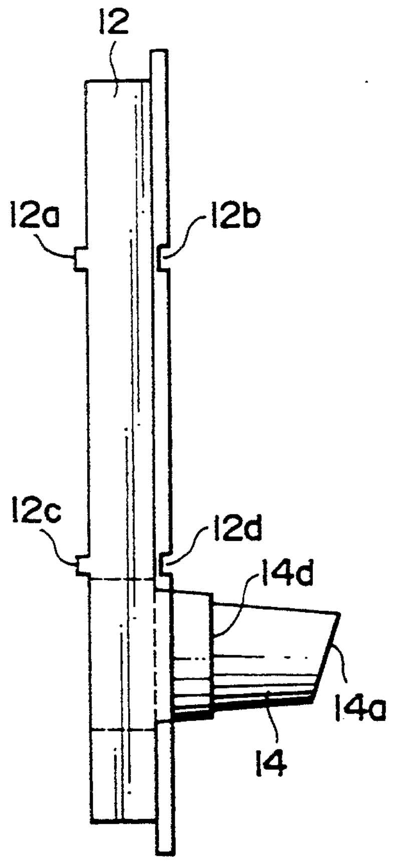

As shown in FIG. 8*a,* reference numeral 12 denotes a baffle plate having such a structure. First and second projections 12*a* and 12*c* are formed on the outer surface of the baffle plate 12, and first and second recesses 12*b* and 12*d* are formed on the inner surface of the baffle plate 12. In stacking a plurality of baffle plates 12 each having this structure, the first and second projections 12*a* and 12*c* of each baffle plate 12 are engaged with the first and second recesses 12*b* and 12*d* of the adjacent baffle plate 12, respectively. Accordingly, the plural baffle plates 12 in the stacked condition can be positioned.

Figure 8B:
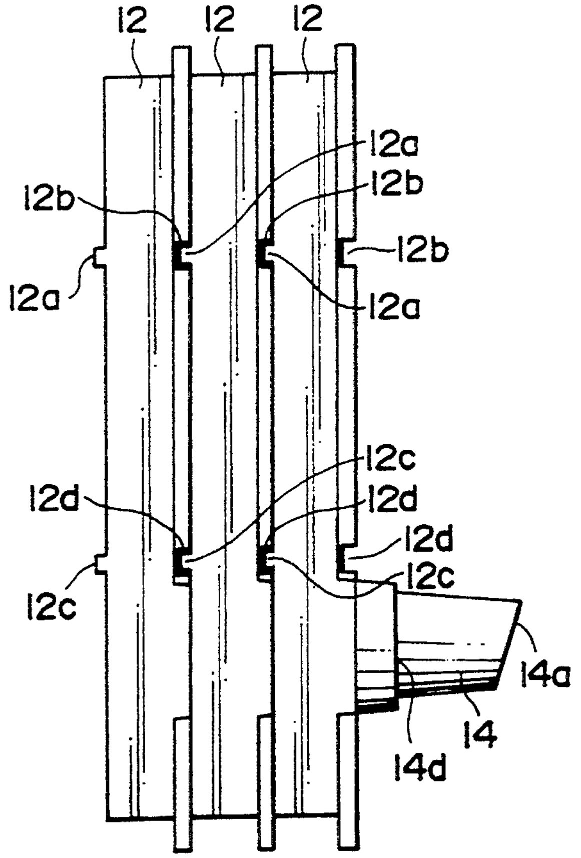

According to the structure of the baffle plate 12 shown in FIG. 8*a,* it is convenient to stack a plurality of baffle plates each with a duct mounted thereto and then package the baffle plates in the stacked condition. That is, as shown in FIG. 8*b,* the first and second projections 12*a* and 12*c* are engaged with the first and second recesses 12*b* and 12*d,* respectively, in the stacked condition of the baffle plates 12, thereby positioning the baffle plates 12 in all the directions of height, width, and stacking thereof. Accordingly, stacking and packaging can be done very easily.

There will now be described some specific structures of the baffle plate to be used in the speaker system of the present invention with reference to FIGS. 11*a* to 11*k* and FIGS. 12*a* to 12*l.*

FIGS. 11*a* to 11*k* show a preferred embodiment of the baffle plate to be used in the speaker system according to the present invention. In particular, a pair of ducts having parallel axes are mounted on the baffle plate.

Referring to FIGS. 11*a* to 11*k,* reference numeral 12 generally denotes a baffle plate. A pair of ducts $\mathbf{14_1}$ and $\mathbf{14_2}$ are mounted on the baffle plate 12.

A mounting hole 22*a* for mounting a speaker unit (not shown in FIGS. 11*a* to 11*k*) is formed through the baffle plate 12 at a central portion thereof. The ducts $\mathbf{14_1}$ and $\mathbf{14_2}$ are located below the speaker unit, and are laterally juxtaposed in a spaced relationship from each other.

Figure 11A:
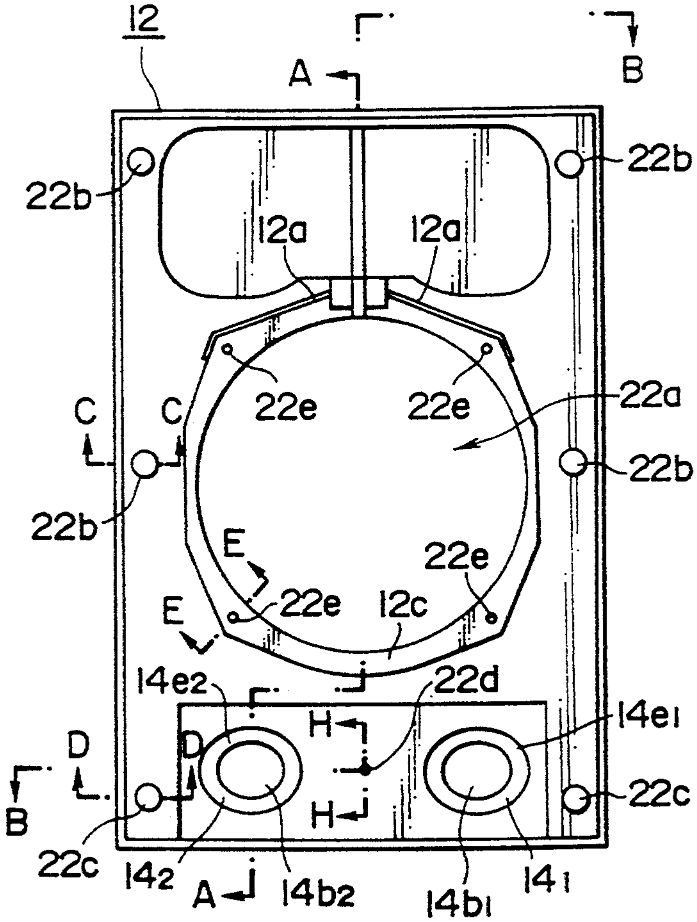

A plurality of boss holes 22*b* and 22*c* for mounting a front cover (not shown) are formed on the front surface of the baffle plate 12 at an outer peripheral portion thereof. The boss holes 22*b* and 22*c* have sectional shapes as shown in FIGS. 11*f* and 11*g,* respectively. A projection 22*d* is formed on the front surface of the baffle plate 12 at a position intermediate between the ducts $\mathbf{14_1}$ and $\mathbf{14_2}$. The projection 22*d* has a sectional shape as shown in FIG. 11*k.* A plurality of (four) through holes 22*e* are formed around the mounting hole 22*a.* The through holes 22*e* serve as bolt holes for mounting the speaker unit. Each through hole 22*e* has a sectional shape as shown in FIG. 11*h.*

Figure 11B:
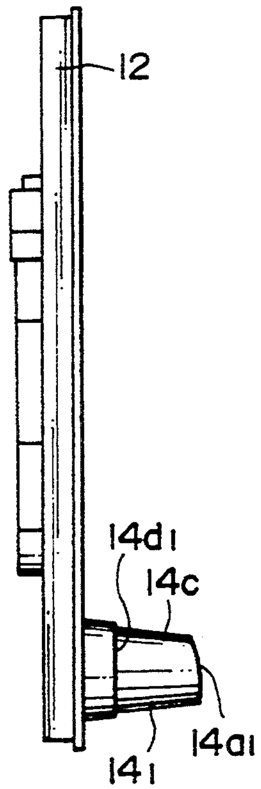
Figure 11C:
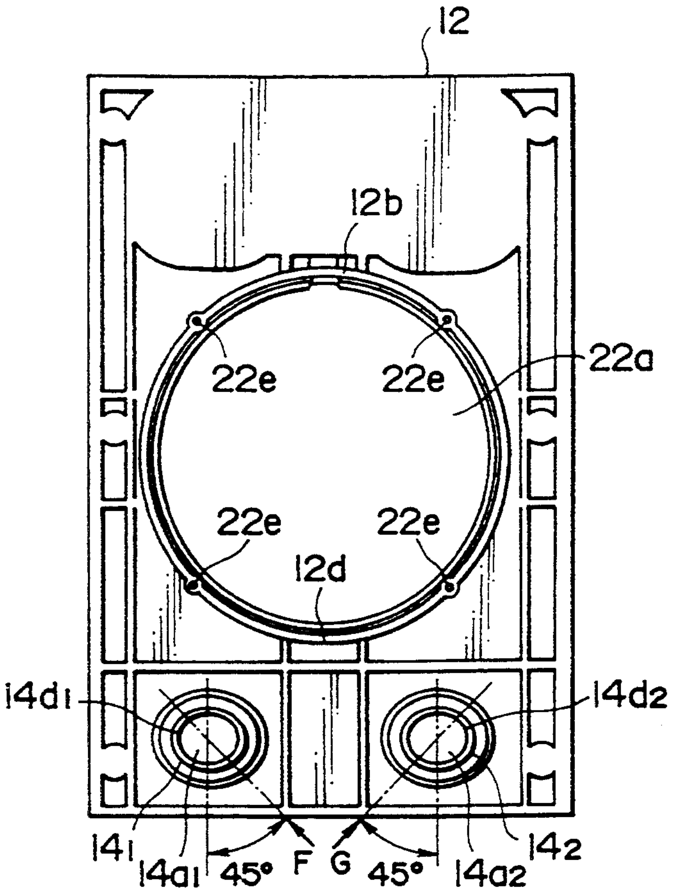
Figure 11D:
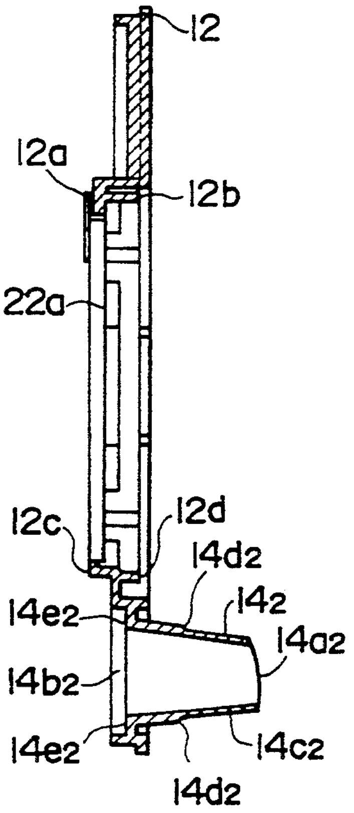

As shown in FIGS. 11*b,* 11*d,* and 11*e,* a body $\mathbf{14c_1}$ of the duct $\mathbf{14_1}$ is substantially frustoconical in shape (i.e., an obliquely truncated cone) so that the sectional area of the body $\mathbf{14c_1}$ is gradually reduced from an outer opening $\mathbf{14b_1}$ to an inner opening $\mathbf{14a_1}$. Similarly, a body $\mathbf{14c_2}$ of the duct $\mathbf{14_2}$ is substantially frustoconical in shape so that the sectional area of the body $\mathbf{14c_2}$ is gradually reduced from an outer opening $\mathbf{14b_2}$ to an inner opening $\mathbf{14a_2}$.

The inner opening $\mathbf{14a_1}$ is formed at the obliquely cut end of the body $\mathbf{14c_1}$ in such a manner as to lie on a plane not perpendicular to the axis of the body $\mathbf{14c_1}$ of the duct $\mathbf{14_1}$. Similarly, the inner opening $\mathbf{14a_2}$ is formed at the obliquely cut end of the body $\mathbf{14c_2}$ in such a manner as to lie on a plane not perpendicular to the axis of the body $\mathbf{14c_2}$ of the duct $\mathbf{14_2}$.

Figure 11E:
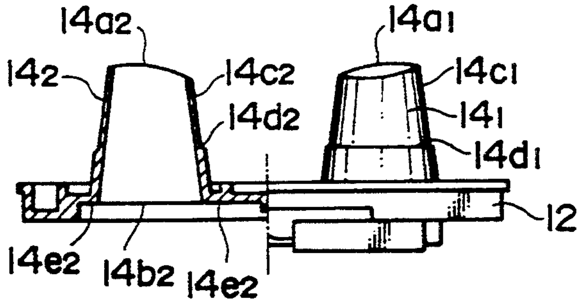
Figure 11F:
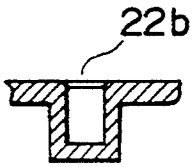
Figure 11G:
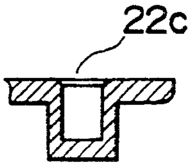
Figure 11H:
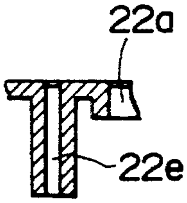

As apparent from FIG. 11*e,* the inner opening $\mathbf{14a_1}$ of the duct $\mathbf{14_1}$ and the inner opening $\mathbf{14a_2}$ of the duct $\mathbf{14_2}$ are opposed to each other.

Figure 11I:
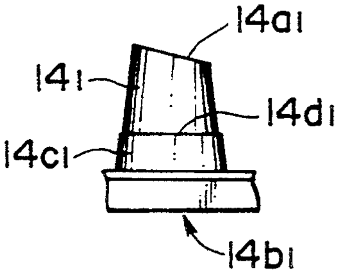
Figure 11J:
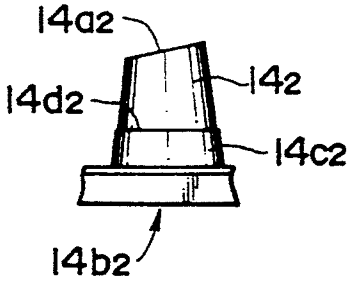
Figure 11K:
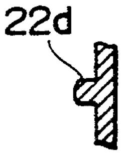

In particular, as apparent from FIGS. 11*i* and 11*j* taken in the directions of the arrows F and G, respectively, in FIG. 11*c,* the inner openings $\mathbf{14a_1}$ and $\mathbf{14a_2}$ are directed to the speaker unit both at the elevation angle of 45°. In other words, the inner openings $\mathbf{14a_1}$ and $\mathbf{14a_2}$ are directed in the condition shown in FIGS. 4*e*-1 and 4*e*-2.

According to the structure of the ducts $\mathbf{14_1}$ and $\mathbf{14_2}$, a plurality of such ducts as independent parts can be stacked in a telescopic fashion, or a plurality of baffle plates 12 each with the ducts $14_1$ and $14_2$ mounted thereto as independent parts can be stacked with a reduced dead space. Thus, packaging and transporting efficiencies can be greatly improved.

Further, the inner surfaces of the bodies $14c_1$ and $14c_2$ of the ducts $14_1$ and $14_2$ are tapering with no parallel surfaces, so that a sound wave introduced into each duct is reflected as shown by the arrow $M_N$ in FIG. 9, thus suppressing the occurrence of resonance in air column.

The inner openings $14a_1$ and $14a_2$ are formed in oblique planes not perpendicular to the axes of the bodies $14c_1$ and $14c_2$. Accordingly, although the bodies $14c_1$ and $14c_2$ are tapering to the inner openings $14a_1$ and $14a_2$, a sufficient area of each inner opening can be obtained to thereby eliminate wind noise.

Further, since the inner openings $14a_1$ and $14a_2$ are opposed to each other at the same inclined angle, the conditions of introduction of sound waves into the ducts $14_1$ and $14_2$ can be made substantially equal to each other, and therefore sound waves to be radiated from the ducts $14_1$ and $14_2$ can be easily made equal to each other.

Further, the inner openings $14a_1$ and $14a_2$ of the ducts $14_1$ and $14_2$ are directed to the speaker unit. Therefore, sound wave radiated from the rear surface of the speaker unit and directly reaching the inner openings $14a_1$ and $14a_2$ can be efficiently introduced into the ducts $14_1$ and $14_2$, thereby relatively reducing a resonance component by reflected sound waves in the enclosure. As a result, a sound quality can be improved as shown in FIG. 10. In particular, a frequency characteristic in a middle frequency range can be improved.

The angles of orientation of the inner openings $14a_1$ and $14a_2$ of the ducts $14_1$ and $14_2$ may be variously changed in the range from $-90°$ to $+90°$ as shown in FIGS. 4*b*-1 to 4*e*-2, thereby effecting tone control. Accordingly, the ducts $14_1$ and $14_2$ can be used as tone control means in designing the speaker system. In modification, the ducts $14_1$ and $14_2$ may be rotatably mounted to the baffle plate 12, thereby allowing a user to desirably conduct tone control.

As apparent from FIGS. 11*b*, 11*d*, and 11*e*, shoulders $14d_1$ and $14d_2$ are formed on the outer circumferential surfaces of the bodies $14c_1$ and $14c_2$, respectively. The shoulders $14d_1$ and $14d_2$ have such sizes that they abut circumferential end surfaces $14e_1$ and $14e_2$ formed about the outer openings $14b_1$ and $14b_2$, respectively.

Figure 7A:
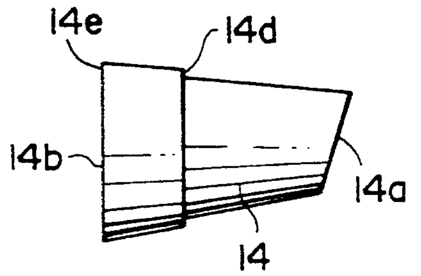
Figure 7B:
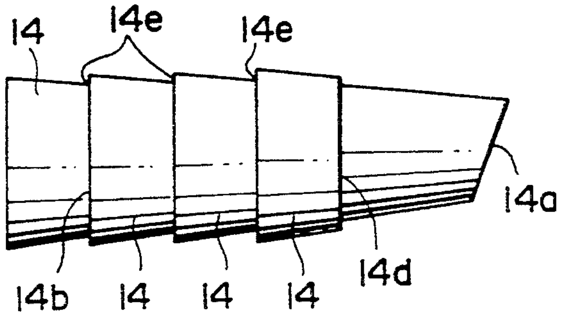

In stacking such ducts as independent parts, or stacking the baffle plates 12 having such ducts as independent parts, the shoulders 14*d* abut the end surfaces 14*e* as shown in FIG. 7*b*, thereby preventing tight fitting of the ducts. Accordingly, the ducts or the baffle plates having the ducts can be uniformly stacked to effect easy packaging, and the ducts in the stacked condition can be easily separated from each other.

As apparent from FIGS. 11*a*, 11*c*, and 11*d*, a first abutting portion 12*a* is formed on the front surface of the baffle plate 12 at a position just over the mounting hole 22*a*, and a second abutting portion 12*b* is formed on the rear surface of the baffle plate 12 at a position just behind the first abutting portion 12*a*.

Similarly, a third abutting portion 12*c* is formed on the front surface of the baffle plate 12 at a position just under the mounting hole 22*a*, and a fourth abutting portion 12*d* is formed on the rear surface of the baffle plate 12 at a position just behind the third abutting portion 12*c*.

In stacking and packaging a plurality of baffle plates 12 having such a structure each with or without the ducts $14_1$ and $14_2$, the baffle plates 12 are stacked as schematically shown in FIG. 8*b*. That is, the first and third abutting portions 12*a* and 12*c* of the baffle plate 12 abut against the second and fourth abutting portions 12*b* and 12*d* of the adjacent baffle plate 12 to be stacked, respectively, thereby positioning the baffle plates 12 in the stacked condition in all the directions of height, width, and stacking of each baffle plate 12. Thus, stacking and packaging of the baffle plates 12 can be done very easily.

FIGS. 12*a* to 12*l* show another preferred embodiment of the baffle plate to be used in the speaker system according to the present invention. In particular, a pair of ducts are mounted on the baffle plate as similar to the preferred embodiment shown in FIGS. 11*a* to 11*k*.

The same parts (the same functional parts) as those shown in FIGS. 11*a* to 11*k* are denoted by the same reference numerals, and the detailed explanation of the unessential parts in the present invention will be omitted hereinafter.

As shown in FIGS. 12*b*, 12*e*, 12*d*, and 12*f*, a body $14c_1$ of the duct $14_1$ is substantially frustoconical in shape so that the sectional area of the body $14c_1$ is gradually reduced from an outer opening $14b_1$ to an inner opening $14a_1$. Similarly, a body $14c_2$ of the duct $14_2$ is substantially frustoconical in shape so that the sectional area of the body $14c_2$ is gradually reduced from an outer opening $14b_2$ to an inner opening $14a_2$. The inner opening $14a_1$ is formed at the obliquely cut end of the body $14c_1$ in such a manner as to lie on a plane not perpendicular to the axis of the body $14c_1$ of the duct $14_1$. Similarly, the inner opening $14a_2$ is formed at the obliquely cut end of the body $14c_2$ in such a manner as to lie on a plane not perpendicular to the axis of the body $14c_2$ of the duct $14_2$.

Figure 12A:
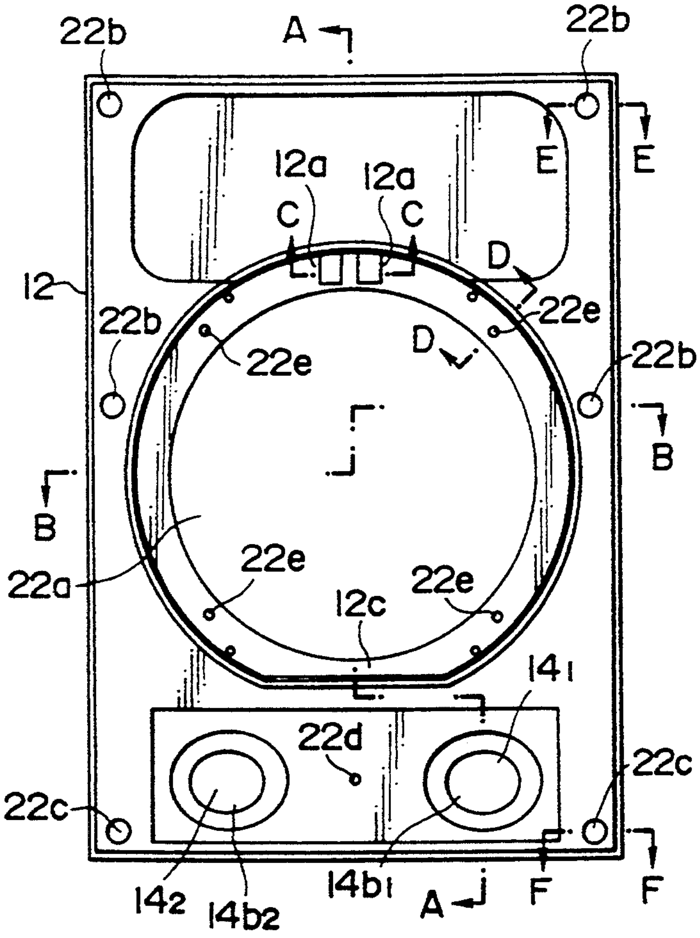
Figure 12B:
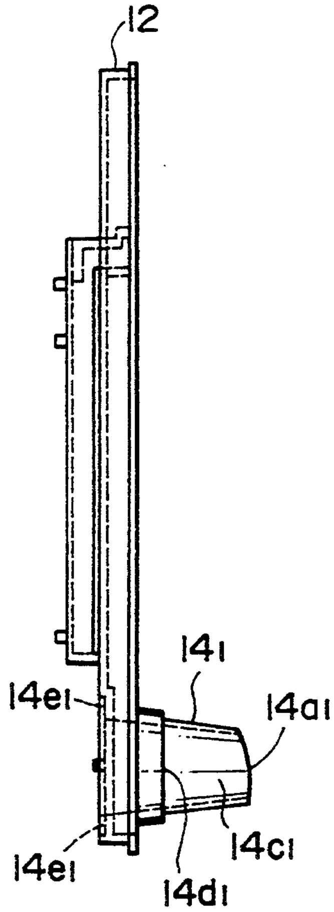
Figure 12C:
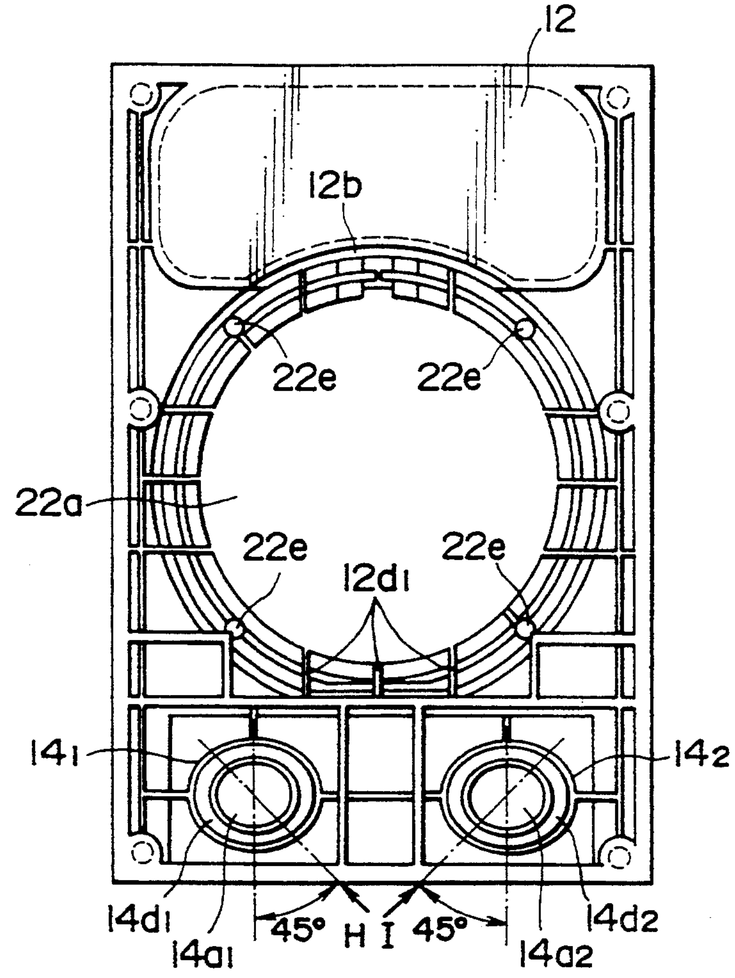
Figure 12D:
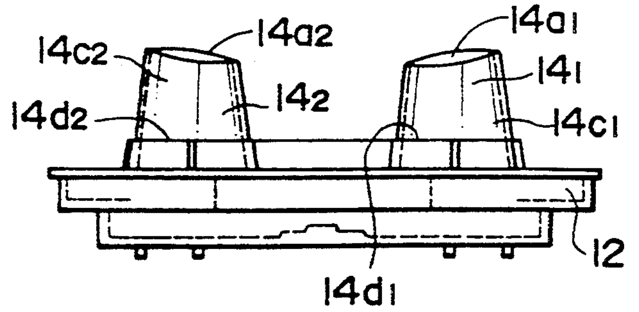
Figure 12E:
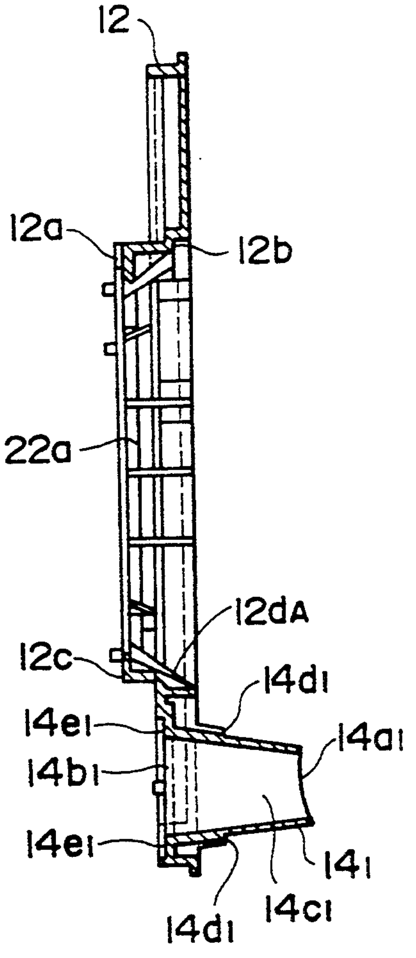
Figure 12F:
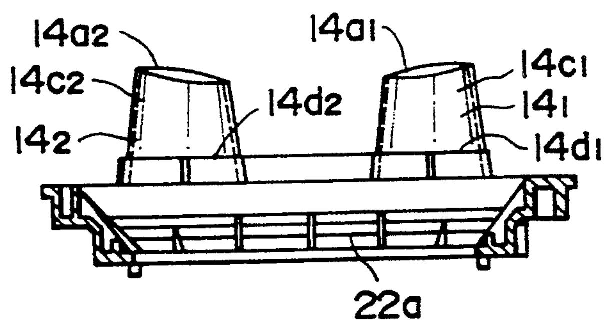
Figure 12G:
Figure 12H:
Figure 12I:
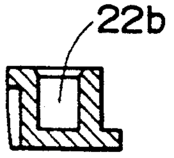
Figure 12J:
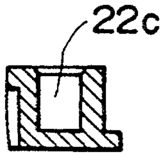
Figure 12K:
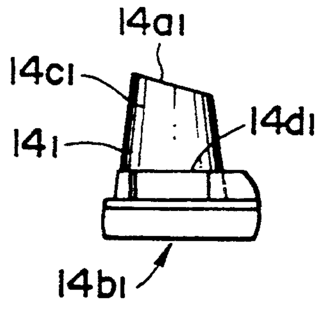
Figure 12L:
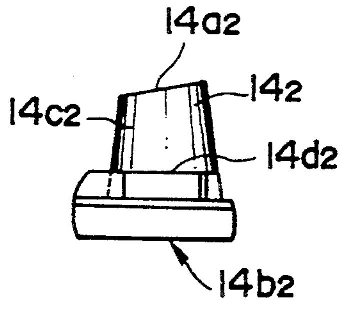

As apparent from FIGS. 12*d* and 12*f*, the inner opening $14a_1$ of the duct $14_1$ and the inner opening $14a_2$ of the duct $14_2$ are opposed to each other. In particular, as apparent from FIGS. 12*k* and 12*l* taken in the directions of the arrows H and I, respectively, in FIG. 12*c*, the inner openings $14a_1$ and $14a_2$ are directed to the speaker unit both at the elevation angle of 45°.

As apparent from FIGS. 12*b*, 12*d*, 12*e*, 12*f*, 12*k*, and 12*l*, shoulders $14d_1$ and $14d_2$ are formed on the outer circumferential surfaces of the bodies $14c_1$ and $14c_2$, respectively. The shoulders $14d_1$ and $14d_2$ have such sizes that they abut circumferential end surfaces $14e_1$ and $14e_2$ formed about the outer openings $14b_1$ and $14b_2$, respectively.

According to the structure of the ducts $14_1$ and $14_2$, a plurality of such ducts can be stacked in a telescopic fashion as similar to the preferred embodiment shown in FIGS. 11*a* to 11*k*. Thus, packaging and transporting efficiencies can be greatly improved. Further, handling can be made easy, and a sound quality can be improved by the elimination of undue resonance sound and wind noise.

As apparent from FIGS. 12*a*, 12*c*, and 12*e*, a first abutting portion 12*a* is formed on the front surface of the baffle plate 12 at a position just over the mounting hole 22*a*, and a second abutting portion 12*b* is formed on the rear surface of the baffle plate 12 at a position just behind the first abutting portion 12*a*.

Similarly, a third abutting portion 12*c* is formed on the front surface of the baffle plate 12 at a position just under the mounting hole 22*a*, and a fourth abutting portion 12dA is formed on the rear surface of the baffle plate 12 at a position just behind the third abutting portion 12c. Unlike the preferred embodiment shown in FIGS. 11a to 11k, the fourth abutting portion 12dA is inclined and tapered.

In stacking and packaging a plurality of baffle plates 12 having such a structure, the first and third abutting portions 12a and 12c of the baffle plate 12 abut against the second and fourth abutting portions 12b and 12dA of the adjacent baffle plate 12 to be stacked, respectively, thereby positioning the baffle plates 12 in the stacked condition in all the directions of height, width, and stacking of each baffle plate 12. Thus, stacking and packaging of the baffle plates 12 can be done very easy. Further, since the fourth abutting portion 12dA is tapered, it is further advantageous that the rattling of the baffle plates 12 in the stacked condition can be prevented.

Although the speaker system having a pair of ducts $14_1$ and $14_2$ has been described above, it should be noted that the present invention may be applied to a speaker system having a single duct or plural pairs of ducts. Further, the positions, the numbers, the shapes, etc. of the shoulder 14d and the end surface 14e of the duct 14 and the abutting portions 12a to 12d (12dA) of the baffle plate 12 mentioned above are merely illustrative.

Further, although the duct 14 is substantially frustoconical and the inner opening 14a is oblique in the above preferred embodiments, the duct may be formed in a substantially pyramidal shape with an obliquely truncated end. Further, the following various modifications may be made in respect of the shape of the duct 14.

Figure 13:
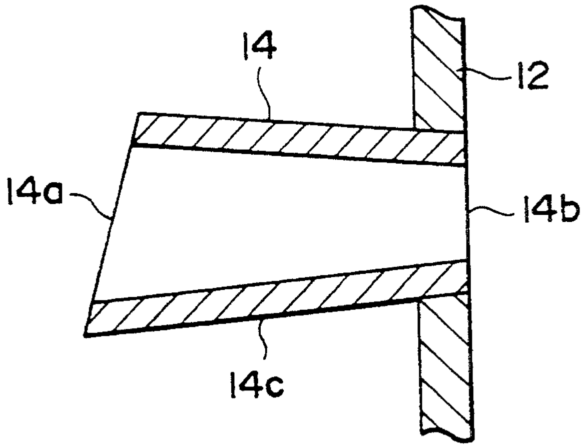
FIGS. 13 through 17 are sectional views illustrating various modifications of the duct in shape according to the present invention.

Referring to FIG. 13, the shape of the duct 14 is such that the body 14c is substantially frustoconical with the sectional area of the body 14c being gradually increased from the outer opening 14b to the inner opening 14a. The inner opening 14a is formed by a flat surface not parallel to the surface of the outer opening 14b.

Figure 14:
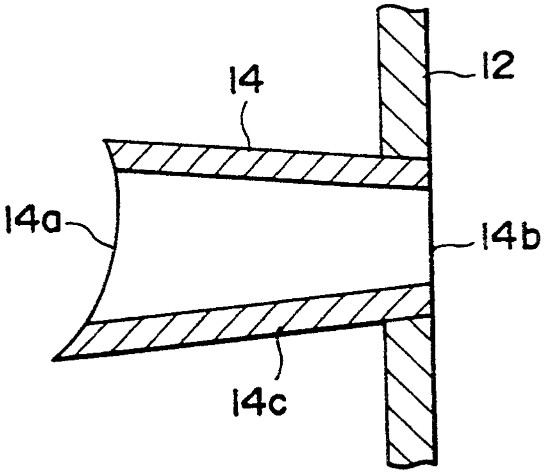

Referring to FIG. 14, the shape of the duct 14 is such that the body 14c is substantially frustoconical with the sectional area of the body 14c being gradually increased from the outer opening 14b to the inner opening 14a. The inner opening 14a is formed by a curved surface not parallel to the surface of the outer opening 14b.

In these shapes of the ducts 14 shown in FIGS. 13 and 14, a plurality of baffle plates 12 having the ducts 14 cannot be stacked with the ducts 14 being fitted in a telescopic fashion. However, the baffle plates 12 without the ducts 14 can be stacked as independent parts. Further, although not shown, a shoulder may be formed on the outer surface of the body 14c as shown in FIG. 7a, so as to improve handling of the ducts 14 only in stacking them. In this case, it is readily understood that the shoulder is so formed as to abut an end surface about the inner opening 14a rather than about the outer opening 14b.

Figure 15:
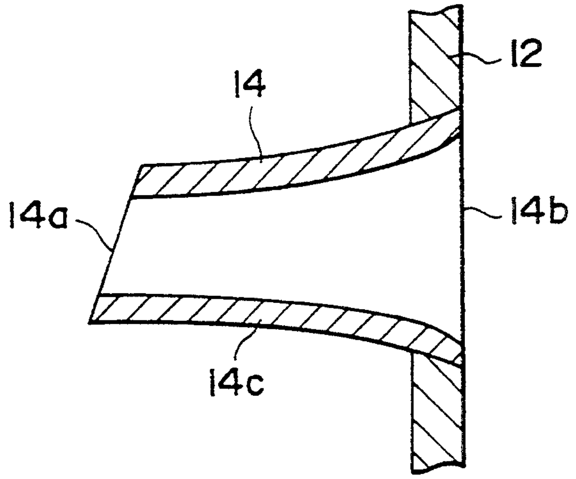

Referring to FIG. 15, the shape of the duct 14 is such that the body 14c is substantially frustoconical with the inner and outer surfaces of the body 14c being formed by curved surfaces. That is, as viewed in cross section taken along the axis of the body 14c, the lines connecting the inner opening 14a and the outer opening 14b are curved lines in this preferred embodiment. In the previous preferred embodiments, the lines connecting the inner opening 14a and the outer opening 14b are straight lines.

Figure 16:
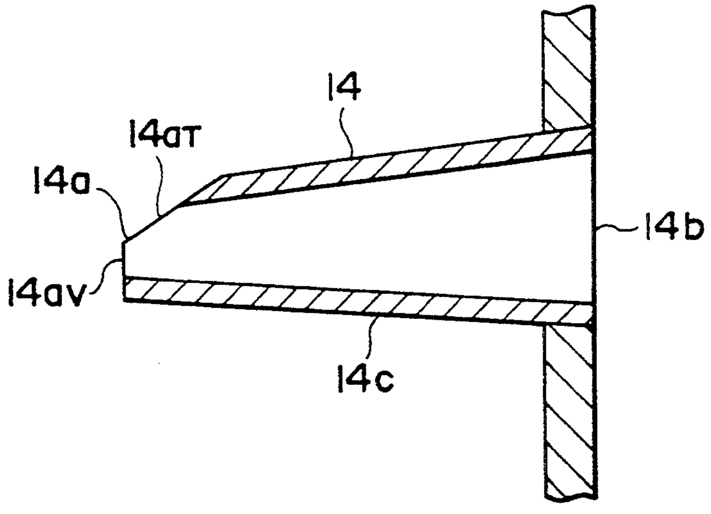

Referring to FIG. 16, the shape of the duct 14 is such that the duct 14c is substantially frustoconical and the inner opening 14a is formed by two flat surfaces 14aV and 14aT. That is, the whole surface of the inner opening 14a is not oblique, but a part of the surface is oblique. The flat surface 14aV is perpendicular to the axis of the body 14c, that is, parallel to the surface of the outer opening 14b. The flat surface 14aT is not perpendicular to the axis of the body 14c, that is, not parallel to the surface of the outer opening 14b. Thus, a part of the inner opening 14a is formed in a plane not perpendicular to the axis of the duct 14. Also in this preferred embodiment, the area of the inner opening 14a can be increased.

Figure 17:
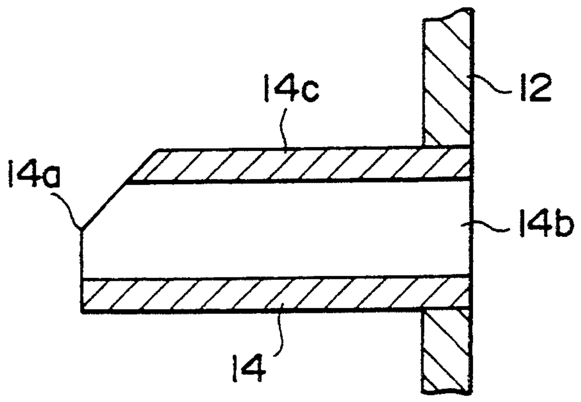

Referring to FIG. 17, the shape of the duct 14 is such that the body 14c is substantially cylindrical rather than substantially frustoconical, and a part of the inner opening 14a is formed by a flat surface not perpendicular to the axis of the body 14c like the preferred embodiment shown in FIG. 16. Of course, the whole surface of the inner opening 14a may be formed by such a flat surface.

In this preferred embodiment, the ducts 14 cannot be stacked in a telescopic fashion; however, the requirement of elimination of wind noise can be met, and tone control can be effected by suitably setting the direction of introduction of sound wave into the duct 14 (i.e., the orientation of the oblique surface of the inner opening 14a).

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A speaker system comprising:

a cabinet;

a baffle plate attached to said cabinet;

a speaker unit mounted on said baffle plate; and at least one duct having a first end mounted on said baffle plate and a second end projecting toward an inside of said cabinet and being disposed along a common linear axis extending between said first end and said second end, said first end of said at least one duct defining an outer opening formed in a first plane parallel to a surface of said baffle plate, said second end of said at least one duct defining an inner opening formed in a second plane inclined relative to said first plane of said outer opening for preventing the occurrence of wind noise in said at least one duct, and wherein said at least one duct has a shape such that a sectional area of said at least one duct is gradually and continuously decreasing from said inner opening to said outer opening or from said outer opening to said inner opening for suppressing the occurrence of resonance in said at least one duct.

2. A speaker system according to claim 1, wherein when a cross section of said at least one duct is taken along said linear axis, lines connecting said inner opening and said outer opening are straight lines.

3. A speaker system according to claim 1, wherein when a cross section of said at least one duct is taken along said linear axis, lines connecting said inner opening and said outer opening are curved lines.

4. A speaker system according to claim 1, further comprising a shoulder formed on an outer surface of said at least one duct.

5. A speaker system comprising:

a cabinet;

a baffle plate attached to said cabinet;

a speaker unit mounted on said baffle plate; and a pair of ducts having parallel axes, each of said ducts having a first end mounted to said baffle plate and a second end projecting toward an inside of said cabinet, said first end of each of said ducts defining an outer opening formed in a first plane parallel to a surface of said baffle plate, said second end of each of said ducts defining an inner opening formed in a second plane inclined relative to said first plane forming said outer opening for preventing the occurrence of wind noise in said ducts, and each of said ducts having a shape such that a sectional area of each of said ducts gradually and continuously decreases from said inner opening to said outer opening or from said inner opening to said outer opening for suppressing the occurrence of resonance in said ducts.

6. A speaker system according to claim 5, wherein said inner openings of said ducts are inclined at a same angle in a range from $-90°$ to $+90°$ in rotational directions about said axes of said ducts.

7. A speaker system according to claim 5, wherein said inner openings of said ducts are each inclined at an angle of $+45°$ so as to be directed to said speaker unit in rotational directions about said axes of said ducts.

8. A speaker system according to claim 5, wherein when a cross section is taken along the axis of each said duct, lines connecting said inner opening and said outer opening are curved lines.

9. A speaker system according to claim 5, further comprising a shoulder formed on an outer surface of each of said ducts.

10. A baffle plate for a speaker system, comprising:

a plate portion having a first surface and a second opposite surface, said plate portion having a mounting hole for mounting a speaker unit; and at least one duct provided on said plate portion below said mounting hole, said duct having a first opening end mounted on said plate portion and a second opening end projecting from said plate portion, said duct having a shape such that a sectional area of said duct is gradually and continuously decreasing from said first opening end to said second opening end, said duct being formed with a shoulder on an outer surface thereof, and further comprising a first abutting portion formed on said first surface of said plate portion, and a second abutting portion formed on said second surface of said plate portion, wherein when a plurality of said baffle plates having identical construction are stacked on each other, said first abutting portion of each of said baffle plates abuts said second abutting portion of an adjacent baffle plate, so that said baffle plates are relatively positioned in a stacked condition.

* * * * *